(12) United States Patent
Haigh

(10) Patent No.: US 8,497,700 B2
(45) Date of Patent: Jul. 30, 2013

(54) SYSTEMS AND METHODS FOR PROPAGATING DIGITAL DATA ACROSS AN ISOLATION BARRIER

(75) Inventor: Geoffrey T Haigh, Boxford, MA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 5 days.

(21) Appl. No.: 13/278,583

(22) Filed: Oct. 21, 2011

(65) Prior Publication Data
US 2013/0099817 A1  Apr. 25, 2013

(51) Int. Cl.
*H03K 19/003* (2006.01)

(52) U.S. Cl.
USPC .............................................. 326/21; 326/31

(58) Field of Classification Search
USPC ............ 326/21–22, 26–28, 31, 62–63, 80–81
See application file for complete search history.

(56) References Cited

U.S. PATENT DOCUMENTS

| | | | |
|---|---|---|---|
| 4,748,419 A | 5/1988 | Somerville | |
| 4,859,877 A | 8/1989 | Cooperman | |
| 5,384,808 A | 1/1995 | Van Brunt | |
| 5,444,600 A | 8/1995 | Dobkin | |
| 5,589,709 A | 12/1996 | Dobkin | |
| 5,650,357 A | 7/1997 | Dobkin | |
| 5,926,358 A | 7/1999 | Dobkin | |
| 5,945,728 A | 8/1999 | Dobkin | |
| 5,952,849 A | 9/1999 | Haigh | |
| 6,169,801 B1 | 1/2001 | Levasseur | |
| 6,249,171 B1 | 6/2001 | Yaklin | |
| 6,262,600 B1 | 7/2001 | Haigh | |
| 6,389,063 B1 | 5/2002 | Kanekawa | |
| 6,430,229 B1 | 8/2002 | Scott | |
| 6,525,566 B2 | 2/2003 | Haigh | |
| 6,728,320 B1* | 4/2004 | Khasnis et al. | ............... 375/257 |
| 6,806,751 B2 | 10/2004 | Helfinstine | |
| 6,819,169 B1 | 11/2004 | Kunc | |
| 6,873,065 B2 | 3/2005 | Haigh | |
| 6,903,578 B2 | 6/2005 | Haigh | |
| 7,075,329 B2 | 7/2006 | Chen | |
| 7,110,531 B2 | 9/2006 | Prendergast | |
| 7,203,224 B2 | 4/2007 | Scott | |
| 7,302,247 B2 | 11/2007 | Dupuis | |
| 7,305,037 B2 | 12/2007 | Josefsson | |
| 7,368,957 B2 | 5/2008 | Clarkin | |
| 7,447,492 B2 | 11/2008 | Dupuis | |
| 7,460,604 B2 | 12/2008 | Dupuis | |
| 7,514,844 B2 | 4/2009 | Unkrich | |
| 7,535,262 B2 | 5/2009 | Abdoulin | |
| 7,545,059 B2 | 6/2009 | Chen | |
| 7,577,223 B2 | 8/2009 | Alfano | |
| 7,586,392 B2 | 9/2009 | Unkrich | |
| 7,610,422 B2 | 10/2009 | Bliss | |
| 7,650,130 B2 | 1/2010 | Dupuis | |
| 7,683,654 B2 | 3/2010 | Chen | |

(Continued)

*Primary Examiner* — James H Cho

(57) ABSTRACT

Systems and methods pertaining to propagation of digital data from a transmit side domain to a receive side domain through an intermediate isolation barrier are described. Specifically, a carrier waveform is superimposed upon a first logic level of a digital signal that is referenced to a first local ground. The digital signal with the superimposed first carrier waveform is propagated through the intermediate isolation barrier. On the receive side domain, the propagated digital signal is processed using a second local ground that is different than the first local ground, the processing including the use of the carrier waveform to enforce the first logic level upon an output digital signal generated from the propagated digital signal.

17 Claims, 14 Drawing Sheets

U.S. PATENT DOCUMENTS

| | | |
|---|---|---|
| 7,692,444 B2 | 4/2010 | Chen |
| 7,701,731 B2 | 4/2010 | Dhuyvetter |
| 7,719,305 B2 | 5/2010 | Chen |
| 7,737,871 B2 | 6/2010 | Leung |
| 7,738,568 B2 | 6/2010 | Alfano |
| 7,755,400 B2 | 7/2010 | Jordanger |
| 7,821,428 B2 | 10/2010 | Leung |
| 7,856,219 B2 | 12/2010 | Dupuis |
| 7,864,546 B2 | 1/2011 | Dhuyvetter |
| 8,198,951 B2 * | 6/2012 | Dong et al. ............. 333/12 |
| 2008/0159360 A1 * | 7/2008 | Florence et al. ............. 375/211 |

* cited by examiner

SYSTEMS AND METHODS FOR PROPAGATING DIGITAL DATA ACROSS AN ISOLATION BARRIER

DESCRIPTION OF THE RELATED ART

Numerous hurdles need to be overcome when propagating digital data from a transmit side domain to a receive side domain across an intermediate isolation barrier. These hurdles become even more significant when electronic circuitry located in each of the two domains use two different ground potential references (as is often the case).

Amongst the numerous hurdles, a first one pertains to overcoming the adverse effects of common mode voltage transients that may exist in the two domains as a result of the two different ground potential references. The adverse effects of such common mode voltage transients may be mitigated to some extent by selecting an isolation barrier of an appropriate material that provides a desired level of electrical isolation between the two domains, or by adding protective circuitry in the two domains.

A second hurdle pertains to maintaining temporal accuracy in terms of accurately and quickly propagating from the first domain to the second domain, edge transitions occurring in the digital data. Various approaches have been taken to do so, by using various types of signal coupling elements, such as capacitive, inductive, acoustic, and optical coupling elements. Each approach provides certain benefits, while also suffering from certain handicaps.

A third hurdle pertains to ensuring digital logic level synchronization, whereby a digital logic level recovered in the receive side domain should be accurately reflective of a corresponding digital logic level in the transmit side domain. For example, under certain conditions, a logic low level may be erroneously indicated in the receive side domain even though the corresponding digital logic level in the transmit side domain is a logic high level. Such an undesirable condition may occur as a result of several scenarios.

To elaborate upon one such scenario, an edge transition from a logic low level to a logic high level that occurs at a first instant of time in the transmit side domain may be accurately propagated through to the receive side domain, thus setting the digital logic level in the receive side domain to a logic high level. A subsequent transition from the logic high level to the logic low level may not occur on the transmit side domain for a significant period of time as a result of inactivity. During this inactive state, one or more circuits on the receive side domain may transition improperly to an erroneous logic low level. Such an occurrence may take place, for example, as a result of a voltage transient, or as a result of a momentary loss in power. Whatever the cause, the improper transition to the logic low level results in a loss of digital logic level synchronization between the transmit and receive side domains.

Various solutions have been proposed in order to ensure digital logic level synchronization between the transmit and receive side domains. However, many of these solutions suffer from one or more handicaps, such as requiring an undesirable increase in the number of signal lines passing through the isolation barrier, or imposing an unacceptable level of temporal inaccuracy.

SUMMARY

According to a first aspect of the disclosure, a method for propagating digital data is provided. The method includes superimposing a carrier waveform upon a first logic level of a digital signal, the digital signal using a first local ground as a reference level. The first digital signal comprising the superimposed carrier waveform, is propagated through an isolation barrier, and the propagated digital signal is processed using a second local ground that is different than the first local ground, the processing comprising using the carrier waveform to enforce the first logic level upon an output digital signal generated from the propagated digital signal.

According to a second aspect of the disclosure, another method for propagating digital data is provided. This method includes superimposing a first carrier waveform upon a first logic level of a complementary pair of digital signals; superimposing a second carrier waveform upon a second logic level of the complementary pair of digital signals; propagating the complementary pair of digital signals comprising the superimposed first and second carrier waveforms, through an isolation barrier; and processing the propagated complementary pair of digital signals using a second local ground that is different than a first local ground used to generate the complementary pair of digital signals, the processing comprising using the first and second carrier waveforms to enforce the first and second logic levels upon an output digital signal generated from the propagated complementary pair of digital signals.

According to a third aspect of the disclosure, a system for propagating digital data is provided. The system includes a transmit circuit, a receive circuit, and an isolation barrier. The transmit circuit is referenced to a first local ground and is configured to superimpose a first carrier waveform upon a first logic level of a first digital signal. The receive circuit is configured to receive the first digital signal after propagation through the isolation barrier, and generate therefrom, an output digital signal, the receive circuit comprising a voltage level enforcer that uses the first carrier waveform to enforce the first logic level upon the output digital signal.

Further aspects of the disclosure are shown in the specification, drawings and claims below.

BRIEF DESCRIPTION OF THE DRAWINGS

Many aspects of the invention can be better understood with reference to the following drawings. The components in the drawings are not necessarily to scale. Instead, emphasis is placed upon clearly illustrating the principles of the invention. Moreover, in the drawings, like reference numerals designate corresponding parts throughout the several views.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it will be understood that terminology such as nodes, terminals, reference voltage, local voltage ground, circuits, blocks, connections, lines, and coupling are used herein as a matter of convenience for description purposes and should not be interpreted literally in a narrow sense. Furthermore, the words "block" or "functional blocks" as used herein refer not only to a circuit contained inside an integrated circuit (IC), but may also refer to various other elements such as a module, a sub-module, or a mechanical assembly that are implemented using multiple ICs and other components. Similarly, the word "line" as used herein may refer to various connectivity elements such as a wire, a cable, a copper track inside an integrated circuit or on a printed circuit board, an optical fiber, or a wireless link.

The description below may describe certain logic levels as being used for activation purposes. For example, a logic high level may be described as being used as a gating signal. It will be understood that in certain other embodiments, a logic low level may be used instead, as can be understood by one of ordinary skill in the art. Also, it must be understood that the word "example" as used herein (in whatever context) is intended to be non-exclusionary and non-limiting in nature. Specifically, the word "exemplary" indicates one among several examples, and it must be understood that no special emphasis is intended or suggested for that particular example. A person of ordinary skill in the art will understand the principles described herein and recognize that these principles can be applied to a wide variety of applications using a wide variety of physical elements.

The various embodiments generally describe systems and methods related to propagating digital data. In particular, described herein are some systems and methods pertaining to propagating digital data from a transmit side domain to a receive side domain through an intermediate isolation barrier. As can be understood by one of ordinary skill in the art, the described systems and methods can be incorporated into a wide variety of applications spanning a wide variety of operating conditions (frequencies, voltages, power etc). In one exemplary application, the transmit side domain, the receive side domain, and the intermediate isolation barrier are all located inside an integrated circuit (IC). The term "integrated circuit" as used herein encompasses a wide variety of devices such as, for example, a standard IC, a customized device, a programmable device, a gate array device, or a hybrid micro circuit.

Figure 1:
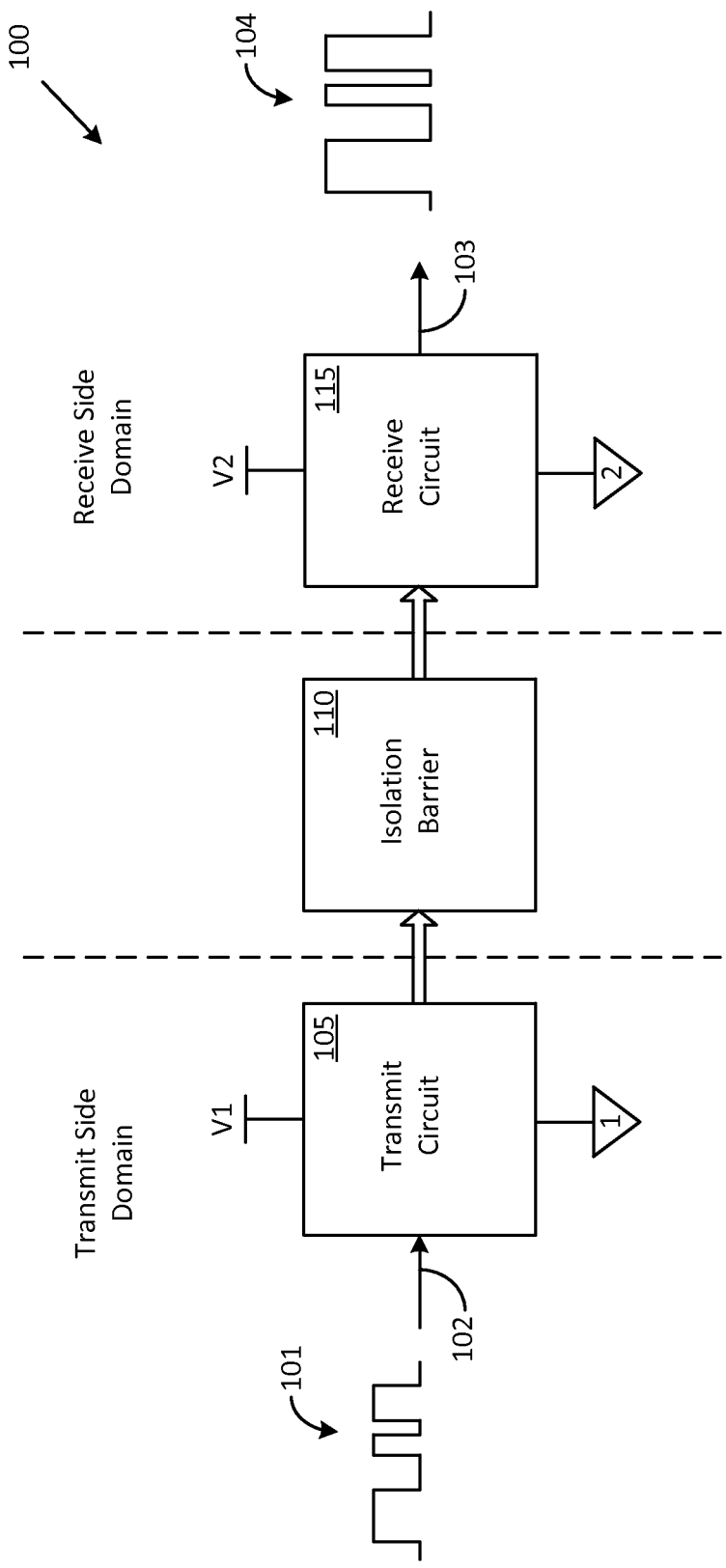
FIG. 1 shows a first exemplary embodiment of a system for propagating digital data across an isolation barrier.

Attention is now drawn to FIG. 1, which shows a first exemplary embodiment of a system 100 for propagating digital data from a transmit circuit 105 located in a transmit side domain, to a receive circuit 115 located in a receive side domain, through an isolation barrier 110. Transmit circuit 105 operates using a voltage V1 that is referenced to a first local ground and is identified in FIG. 1 by the numeral 1 inside an inverted triangle. Receive circuit 115 operates using a voltage V2 that is referenced to a second local ground and is identified in FIG. 1 by the numeral 2 inside an inverted triangle.

In a first exemplary implementation, one or both of the first and second local grounds may be floating grounds that are not connected to real ground (earth). However, in a second exemplary implementation, one or both of the first and second local grounds may be connected to real ground (earth), each via a connecting link having a finite impedance. In either implementation, a voltage differential may exist between the first and the second local ground as a result of the two local grounds not being connected directly to each other, as well as due to the electrical isolation provided by isolation barrier 110 located between transmit circuit 105 and receive circuit 115. The electrical isolation provided by isolation barrier 110 minimizes to some extent, an interaction between common mode voltage transients that may exist in the two domains as a result of the two different local grounds.

Voltage V1 is typically selected to accommodate a signal amplitude level of input digital signal 101. For example, if input digital signal is around 2V, V1 may be selected to have a 3.3V amplitude. Voltage V2 is typically selected to accommodate a desired signal amplitude level of output digital signal 104. For example, if it is desired to produce an output digital signal of 5V amplitude, V2 may be selected to correspond to 5V. One of ordinary skill in the art will understand the rationale behind selecting these voltages, and other, supply voltage levels of different amplitudes and polarities, based on input and output signal amplitudes. It may be also pertinent to point out that in certain embodiments, input digital signal 101 may have a 50% duty cycle. However, in certain other embodiments, input digital signal 101 may have a duty cycle other than 50%, or may be an aperiodic digital signal.

Solely for convenience in description below, the duty cycle of input digital signal 101 may be shown in the various figures as something other than 50%. Specifically, at some instants in time, input digital signal 101 may remain at a logic level (either high or low) for an extended period of time, which may be referred to herein, as an inactive state.

During this inactive state, one or more circuits in receive circuit 115 may transition improperly to an erroneous logic level. Such an occurrence may take place, for example, as a result of a voltage transient, or as a result of a momentary loss in power in the receive side domain. Whatever the cause, the improper transition can result in a loss of digital logic level synchronization between transmit circuit 105 and receive circuit 115. This undesirable situation may be addressed by using the methods and systems described below.

Figure 2:
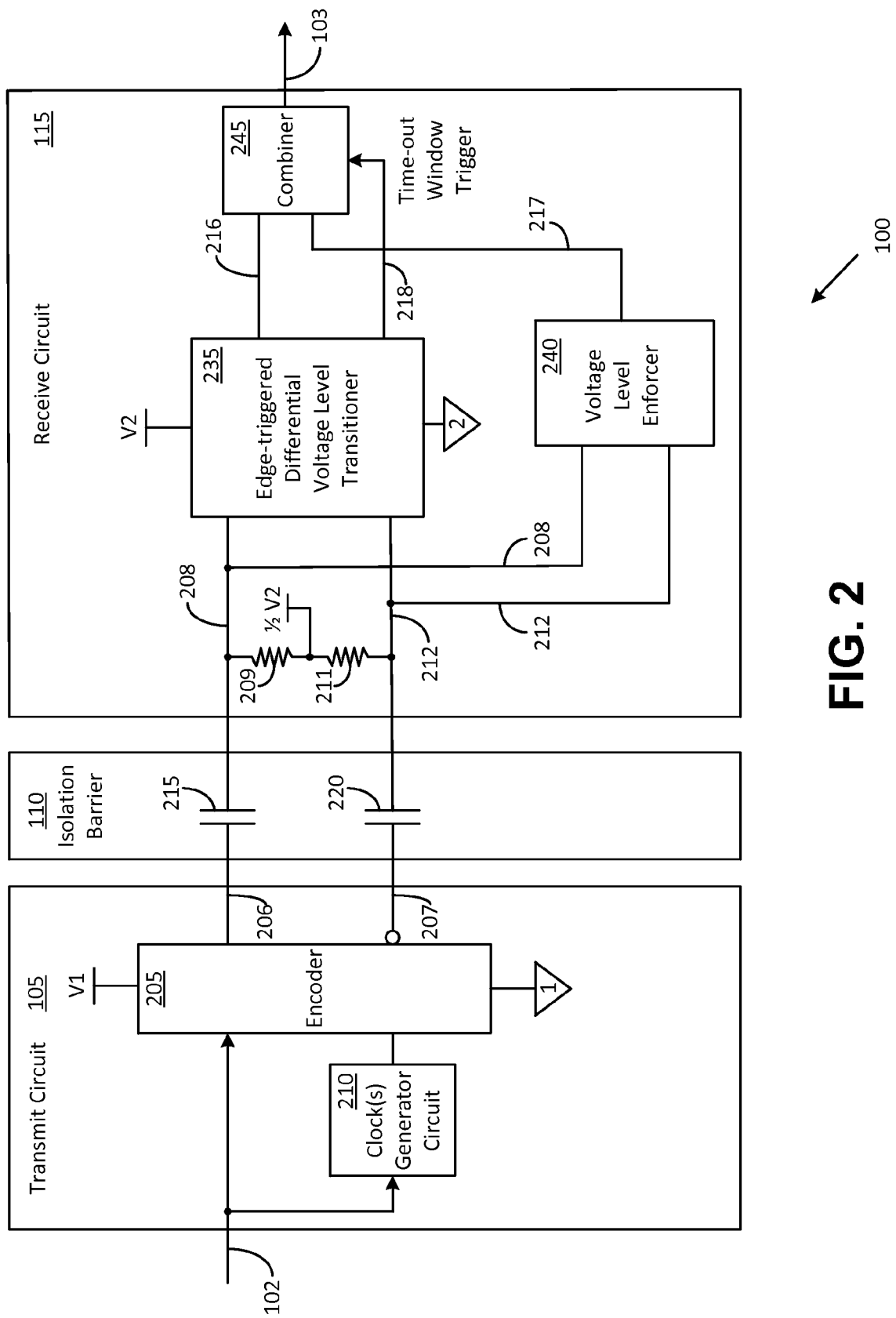
FIG. 2 shows a few functional elements contained inside the functional blocks shown in FIG. 1.

FIG. 2 shows a few functional elements contained inside each of transmit circuit 105, isolation barrier 110, and receive circuit 115. Specifically, transmit circuit 105 includes an encoder 205 and a clock generator circuit 210. During operation, a digital input signal is coupled into encoder 205, which converts the digital input signal into a differential format that is transmitted out of transmit circuit 105 via output lines 206 and 207. The differential format is illustrated in various other figures described below.

The digital input signal on line 102 is also provided to clock generator circuit 210, which generates one or more carrier clocks based on the logic level present in the digital input signal. For example, in one exemplary embodiment that is described below in more detail, clock generator circuit 210 generates a first carrier waveform of a first frequency when the digital input signal is at a logic high level. Subsequently, when the digital input signal is at a logic low level, clock generator circuit 210 generates a second carrier waveform of a second frequency. Encoder 205 superimposes one or both of the first and second carrier waveforms upon the differential digital signal transmitted out of transmit circuit 105 via output lines 206 and 207. This procedure is described below in more detail using other figures.

The differential digital signal transmitted out of transmit circuit 105 via output lines 206 and 207 is coupled into isolation barrier 110, which includes a pair of coupling capacitors 215 and 220. It will be understood that in certain implementations, additional pairs of capacitors may be included in isolation barrier 110 in order to accommodate more than one transmit circuit 105 that may be coupled to isolation barrier 110. Each of coupling capacitors 215 and 220 may be selected to have various capacitance values depending upon the type of signals (frequency, edge transition times etc) that are propagated through isolation barrier 110. In one embodiment, each of coupling capacitors 215 and 220 is selected to have a capacitance value that is a fraction of 1 pf.

The differential digital signal propagated through isolation barrier 110 is coupled to receive circuit 115 via lines 208 and 212. A pair of pull-up resistors 209 and 211 coupled to voltage ½ V2, provide a DC quiescent biasing voltage of ½ V2 on each of lines 208 and 212. Furthermore, the pair of pull-up resistors 209 and 211 operate in conjunction with the pair of coupling capacitors 215 and 210 as an R-C differentiating circuit that performs a differentiating action upon the differential digital signal transmitted out of transmit circuit 105 via output lines 206 and 207. Consequently, each of the signals appearing on lines 208 and 212 appear as positive-going or negative-going transient spikes that are in temporal alignment to the positive-going and negative-going transition edges of the differential digital signal provided to isolation barrier 110 from transmit circuit 105.

The signals appearing on lines 208 and 212 are coupled into edge-triggered differential voltage level transitioner 235 that generates a digital output signal on line 216. The digital output signal on line 216 contains logic high levels and logic low levels that are triggered by the positive-going and negative-going transient spikes present in the signals on lines 208 and 212.

The signals on lines 208 and 212 are also coupled into voltage level enforcer 240 that detects one or more of the carrier waveforms that may be present in the signals and uses the detection to generate a voltage level enforcement signal that is provided to combiner 245 via line 217. Combiner 245 uses the voltage level enforcement signal to enforce the proper logic high levels and logic low levels and generate an output digital signal on line 103.

Combiner 245 carries out voltage level enforcement after a pre-determined timeout period that is enabled via a time-out window trigger provided to combiner 245 via line 218 by edge-triggered differential voltage level transitioner 235. The voltage level enforcement operation is described below in further detail using other figures.

Figure 3:
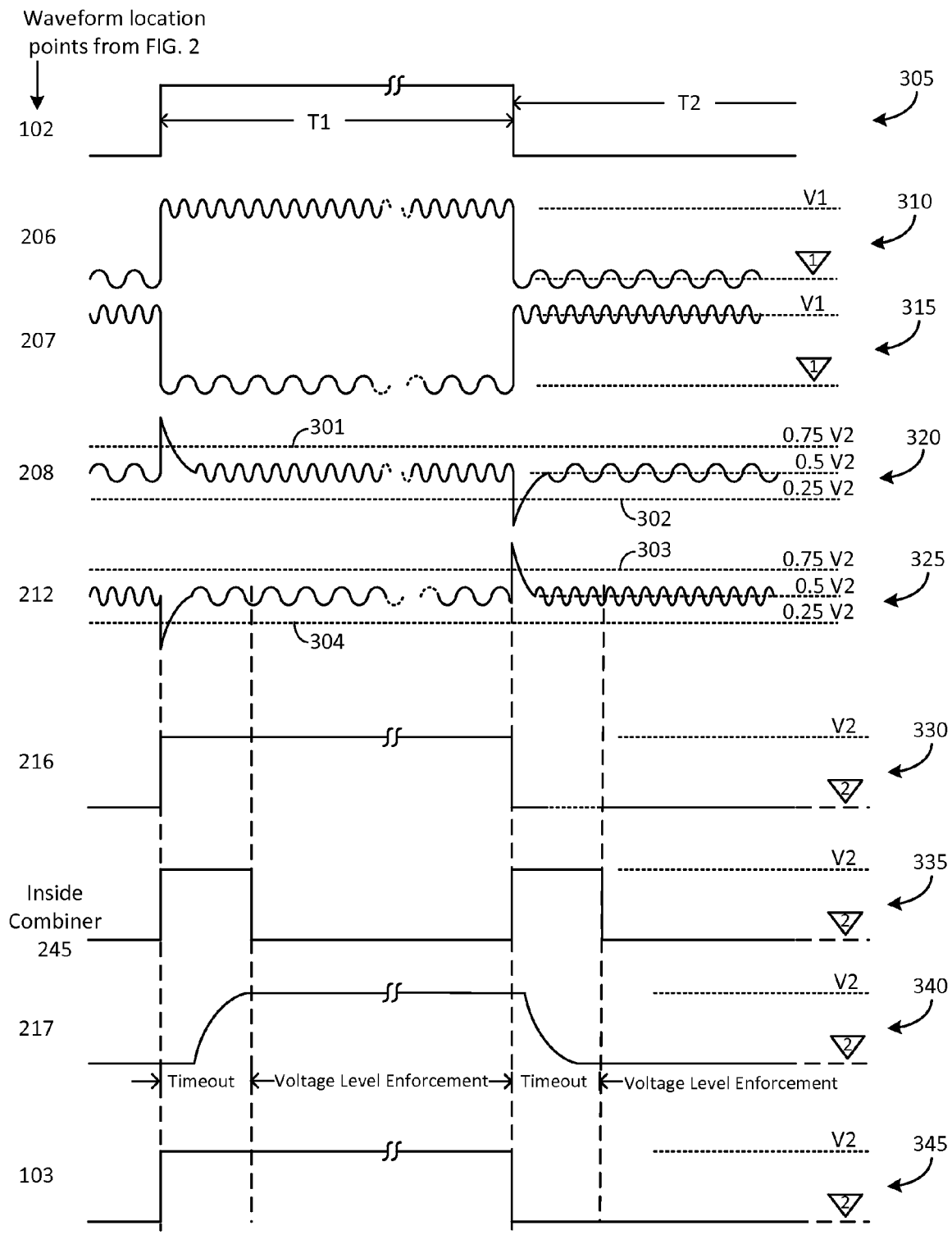
FIG. 3 shows some waveforms that are associated with propagating of digital data in accordance with a first exemplary embodiment of the invention.

FIG. 3 shows some waveforms that are associated with propagating of digital data from transmit circuit 105 to receive circuit 115 via isolation barrier 110 in accordance with a first exemplary embodiment of the invention. The locations of the various waveforms correspond to various numeric designators shown in FIG. 2. Waveform 305 (which is located on line 102 of FIG. 2) corresponds to the input digital signal.

Waveform 305 stays at a logic high level for a period of time designated as T1, and transitions to a logic low level extending over another period of time designated as T2. When the input digital signal is a periodic signal with a 50% duty cycle, T1 is equal to T2, and conversely, when the input digital signal does not have a 50% duty cycle, T1 is not equal to T2. Furthermore, when the input digital signal is an aperiodic signal, each, or both, of T1 and T2 values may vary over time. For purposes of convenience, T1 and T2 may be generally used below with reference to other waveforms as well, ignoring propagation delays that may exist between the various waveforms.

Waveforms 310 and 315 (located on lines 206 and 207 of FIG. 2), correspond to a differential digital signal that is generated by encoder 205, with rising and falling edges corresponding to respective rising and falling edges of waveform 305. It may be pertinent to point out that each of waveforms 305, 310 and 315 has voltage levels corresponding to voltage V1 that is referenced to the first local ground identified in FIG. 1 by the numeral 1 inside an inverted triangle.

In this first exemplary embodiment, a first carrier waveform is superimposed upon waveform 310 during the period of time designated as T1, and a second carrier waveform is superimposed during the period of time designated as T2. In a complementary manner, the second carrier waveform is superimposed upon waveform 315 during the period of time designated as T1, and the first carrier waveform is superimposed during the period of time designated as T2.

The first and second carrier waveforms are different from one another in one or more ways. For example, the first and second carrier waveforms may differ from each other in frequency, phase, or periodicity. Any one or more of these differences can be used to identify the presence of either the first or the second waveform in the receive domain. Furthermore, though the carrier waveforms are depicted herein as sinusoidal waves, in various embodiments, other waveforms, such as for example, a triangular, trapezoidal, saw-tooth, square, pulse trains etc., may be used instead. The carrier waveform detection process is described below in further detail using other figures.

In one exemplary implementation, the frequency of the first carrier waveform is an integer multiple of a frequency of the second carrier waveform. In another exemplary implementation, the frequency of the first carrier waveform is an integer sub-multiple of a frequency of the second carrier waveform. In yet another exemplary implementation, the frequency of the first carrier waveform is a non-integer ratio of a frequency of the second carrier waveform. One example of a non-integer ratio approximately equals 1.7. Another example of a non-integer ratio lies inside an approximate range of 1.6 to 1.8.

As described above using FIG. 2, capacitors 215 and 220 operate in conjunction with resistors 209 and 211 as an R-C differentiating circuit that performs a differentiating action upon the differential digital signal transmitted out of transmit circuit 105. The results of the differentiating action can be perceived in waveforms 320 and 325 that have positive-going and negative-going transient spikes in temporal alignment to the positive-going and negative-going transition edges of waveforms 310 and 315. Specifically, waveform 320 is generated as a result of the action of the R-C differentiating circuit upon waveform 310, while waveform 325 is generated as a result of the action of R-C differentiating circuit upon waveform 315. Waveforms 320 and 325 each have a DC quiescent biasing voltage of ½ V2 as a result of pull-up resistors 209 and 211.

Edge-triggered differential voltage level transitioner 235 receives waveforms 320 and 325 via lines 208 and 212, and generates the digital output signal (waveform 330) on line 216. The threshold trigger levels used by edge-triggered differential voltage level transitioner 235 may be set at different values in accordance with a desired level of hysteresis. For example, in order to avoid false triggers and in order to provide optimal noise immunity, the threshold trigger levels may be set in correspondence to mid-levels voltage that are shown as dashed lines in waveforms 320 and 325.

Thus, with the a DC quiescent biasing voltage of ½ V2, the threshold trigger level for positive-going transient spikes may be set at ¾ V2, while the threshold trigger level for negative-going transient spikes may be set at ¼ V2.

It may be pertinent to point out that each of waveforms 320 and 325 (as well as waveforms 330, 335, 340 and 345) has voltage levels corresponding to voltage V2, which is referenced to the second local ground in the receive side domain.

The time-out window trigger provided by edge-triggered differential voltage level transitioner 235 via line 218, is used by combiner 245 to generate a time-out window (combiner details not shown in FIG. 2) that is indicated in FIG. 3 by waveform 335.

Voltage level enforcer 240 detects the first and second carrier waveforms present in waveforms 320 and 325 to determine the correct digital logic levels during T1 and T2, and uses this information to generate a voltage level enforcement signal that is provided via line 217 to combiner 245. The voltage level enforcement signal is indicated in FIG. 3 by waveform 340.

As can be seen, the rising and falling edges of waveform 340 have finite transition times that may correspond, for example, to exponential rise and fall times. As mentioned above, waveform 335 provides a time-out window functionality that is used in combiner 245 to avoid voltage level enforcement being carried out during the gradual rising and falling edges of waveform 340. The timeout and voltage level enforcement periods are labeled below waveform 340.

Waveform 345 is the output digital signal present on line 103 of receive circuit 115.

Figure 4:
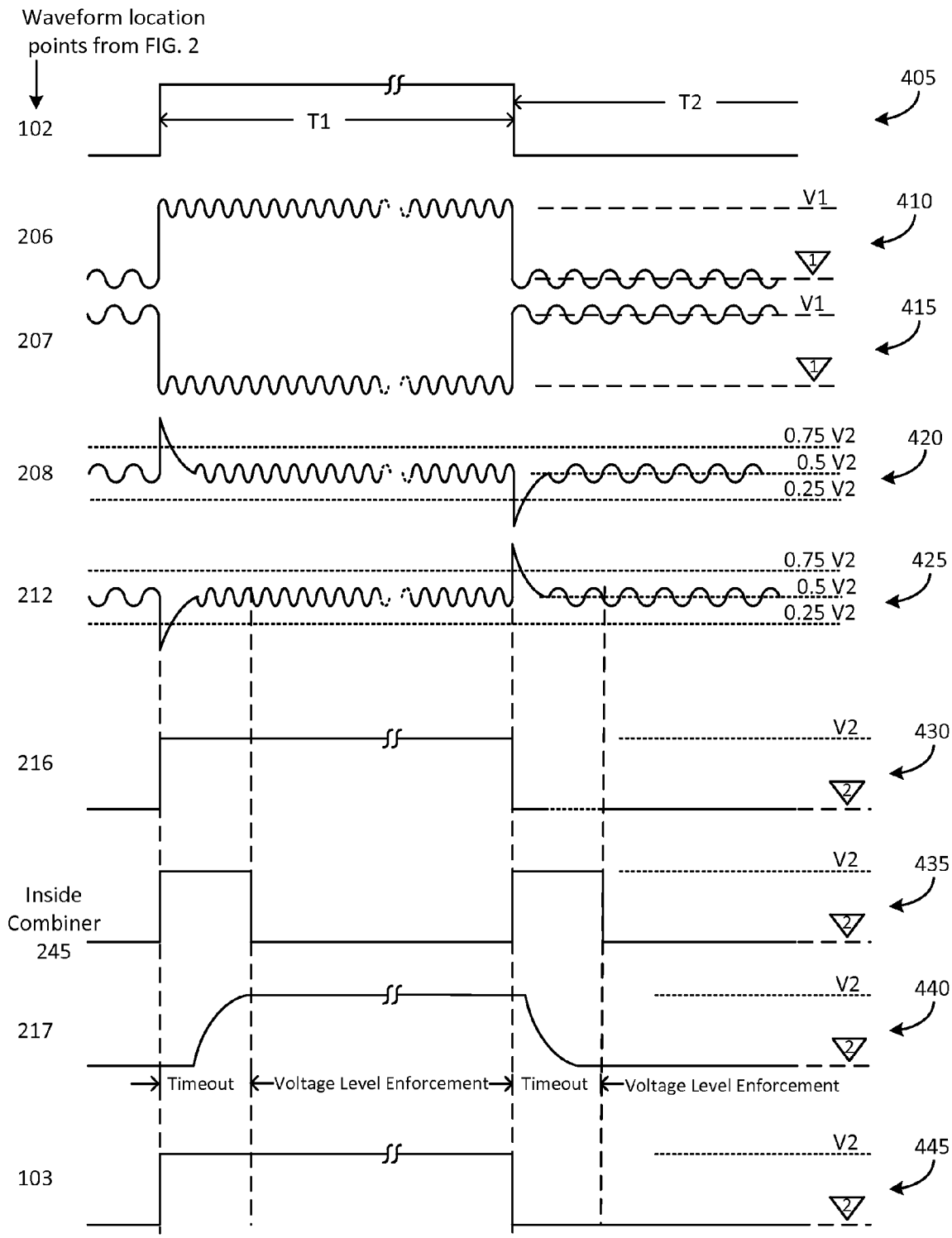
FIG. 4 shows some waveforms that are associated with propagating of digital data in accordance with a second exemplary embodiment of the invention.

FIG. 4 shows some waveforms that are associated with propagating of digital data from transmit circuit 105 to receive circuit 115 via isolation barrier 110 in accordance with a second exemplary embodiment of the invention. In this embodiment, the first carrier waveform is superimposed upon waveform 410, as well as upon waveform 415, during the period of time designated as T1. The second carrier waveform is superimposed upon waveform 410, as well as upon waveform 415, during the period of time designated as T2. Voltage level enforcer 240 detects the first and second carrier waveforms present in waveforms 420 and 425 to determine the correct digital logic levels during T1 and T2, and uses this information to generate a voltage level enforcement signal that is provided via line 217 to combiner 245. The description of the first and second carrier waveforms, as well as waveforms 420, 425, 430, 435, 440 and 445, can be understood from the description provided above using FIG. 3, and will not be repeated herein.

Figure 5:
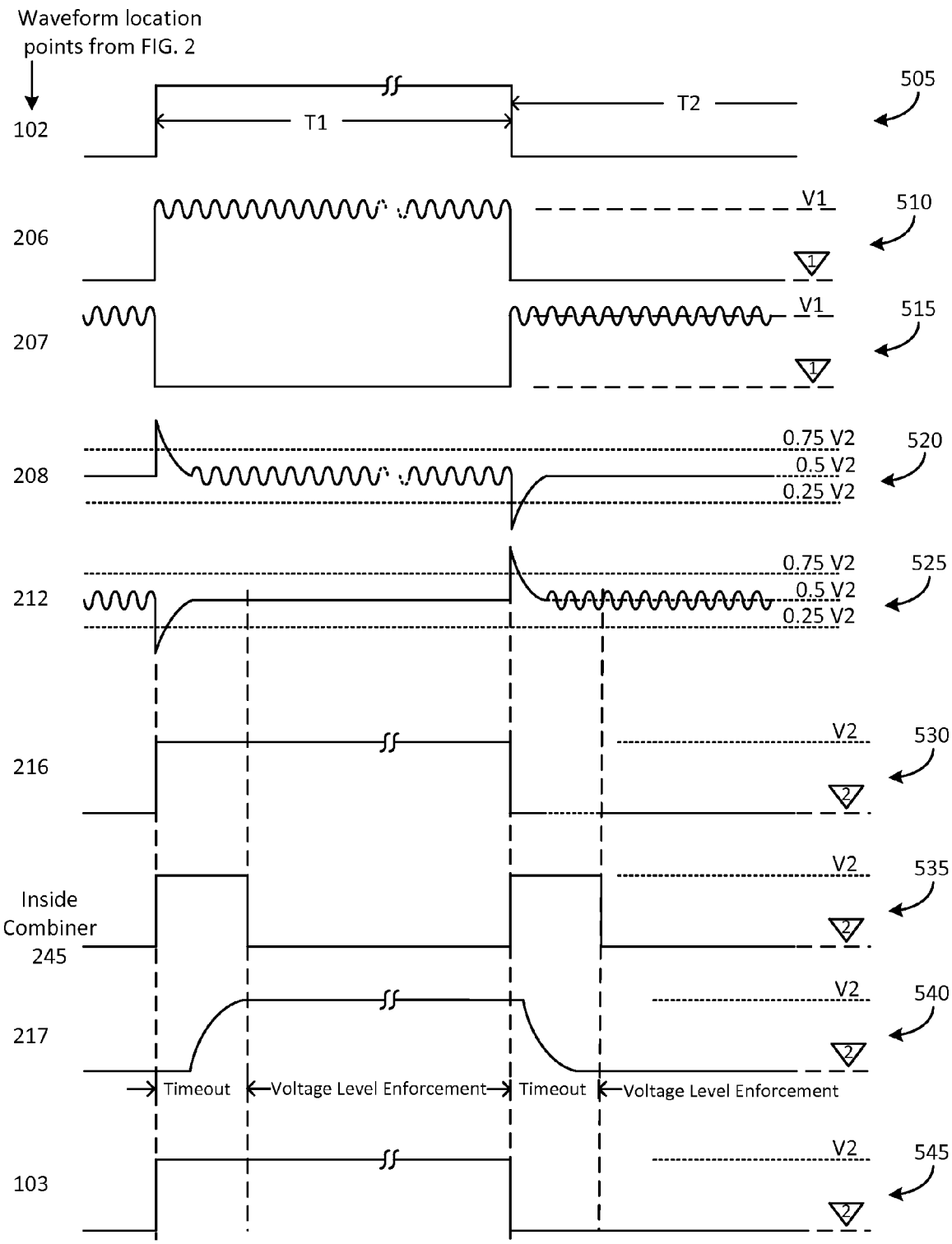
FIG. 5 shows some waveforms that are associated with propagating of digital data in accordance with a third exemplary embodiment of the invention.

FIG. 5 shows some waveforms that are associated with propagating of digital data from transmit circuit 105 to receive circuit 115 via isolation barrier 110 in accordance with a third exemplary embodiment of the invention. In this embodiment, the first carrier waveform is superimposed upon waveform 510 during the period of time designated as T1. However, no carrier waveform is superimposed upon waveform 510 during the period of time designated as T2. As for waveform 515, the first carrier waveform is superimposed during the period of time designated as T2, but no carrier waveform is superimposed upon waveform 515 during the period of time designated as T1.

In contrast to the embodiments described above using FIGS. 3 and 4, the embodiment associated with FIG. 5, uses single carrier detection. Specifically, voltage level enforcer 240 detects the first carrier waveform present in waveforms 520 and 525 to determine the correct digital logic levels during T1 and T2, and uses this information to generate a voltage level enforcement signal that is provided via line 217 to combiner 245. The description of waveforms 520, 525, 530, 535, 540 and 545 can be understood from the description provided above using FIG. 3, and will not be repeated herein.

Figure 6:
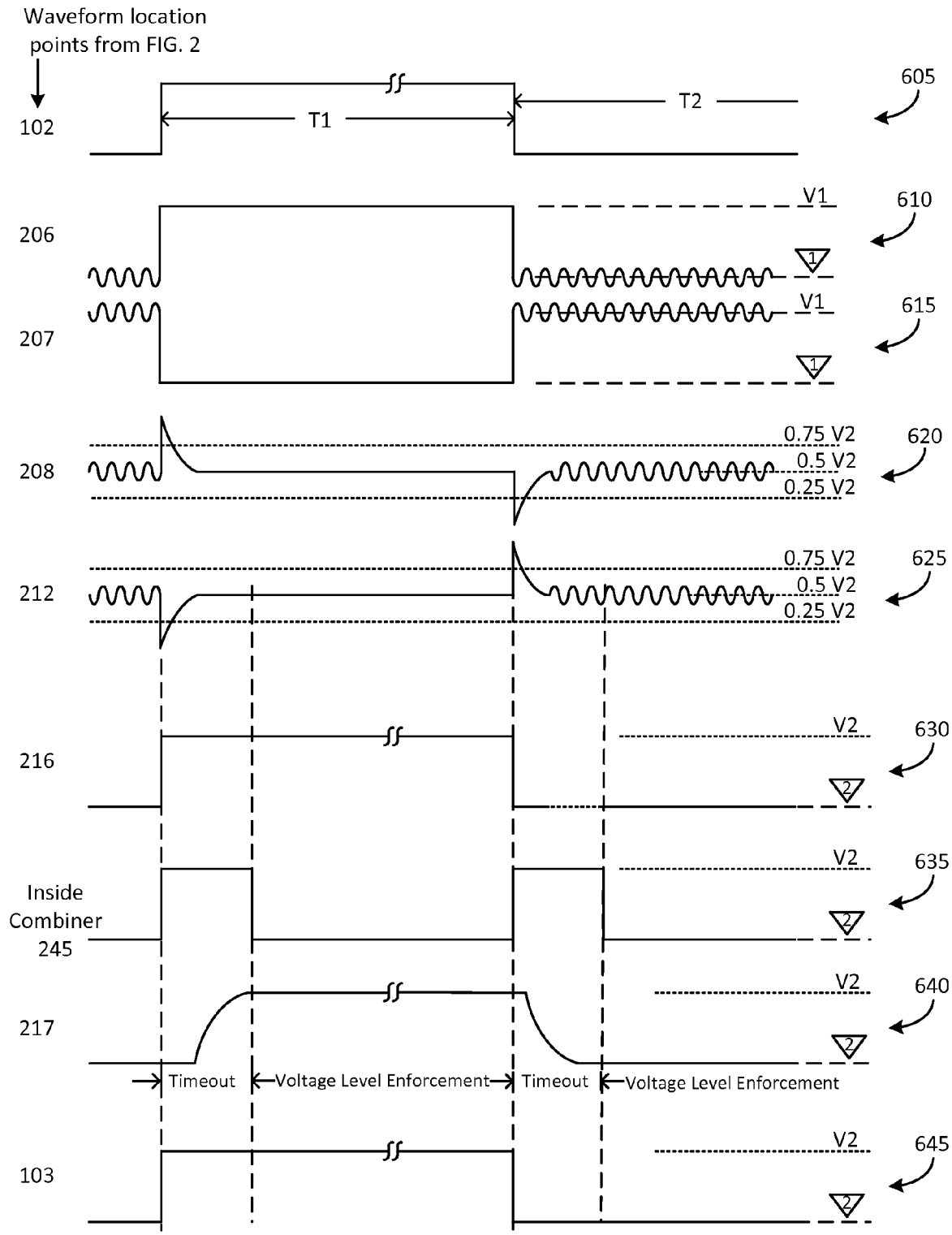
FIG. 6 shows some waveforms that are associated with propagating of digital data in accordance with a fourth exemplary embodiment of the invention.

FIG. 6 shows some waveforms that are associated with propagating of digital data from transmit circuit 105 to receive circuit 115 via isolation barrier 110 in accordance with a fourth exemplary embodiment of the invention. In this embodiment, the first carrier waveform is superimposed upon waveform 610 during the period of time designated as T2. However, no carrier waveform is superimposed upon waveform 610 during the period of time designated as T1. Similarly, the first carrier waveform is superimposed upon waveform 615 during the period of time designated as T2, but no carrier waveform is superimposed upon waveform 615 during the period of time designated as T1.

Similar to the embodiment described above using FIG. 5, the embodiment associated with FIG. 6, uses single carrier detection. Specifically, voltage level enforcer 240 detects the first carrier waveform present in waveforms 620 and 625 to determine the correct digital logic levels during T1 and T2, and uses this information to generate a voltage level enforcement signal that is provided via line 217 to combiner 245. The description of waveforms 620, 625, 630, 635, 640 and 645 can be understood from the description provided above using FIG. 3, and will not be repeated herein.

Figure 7:
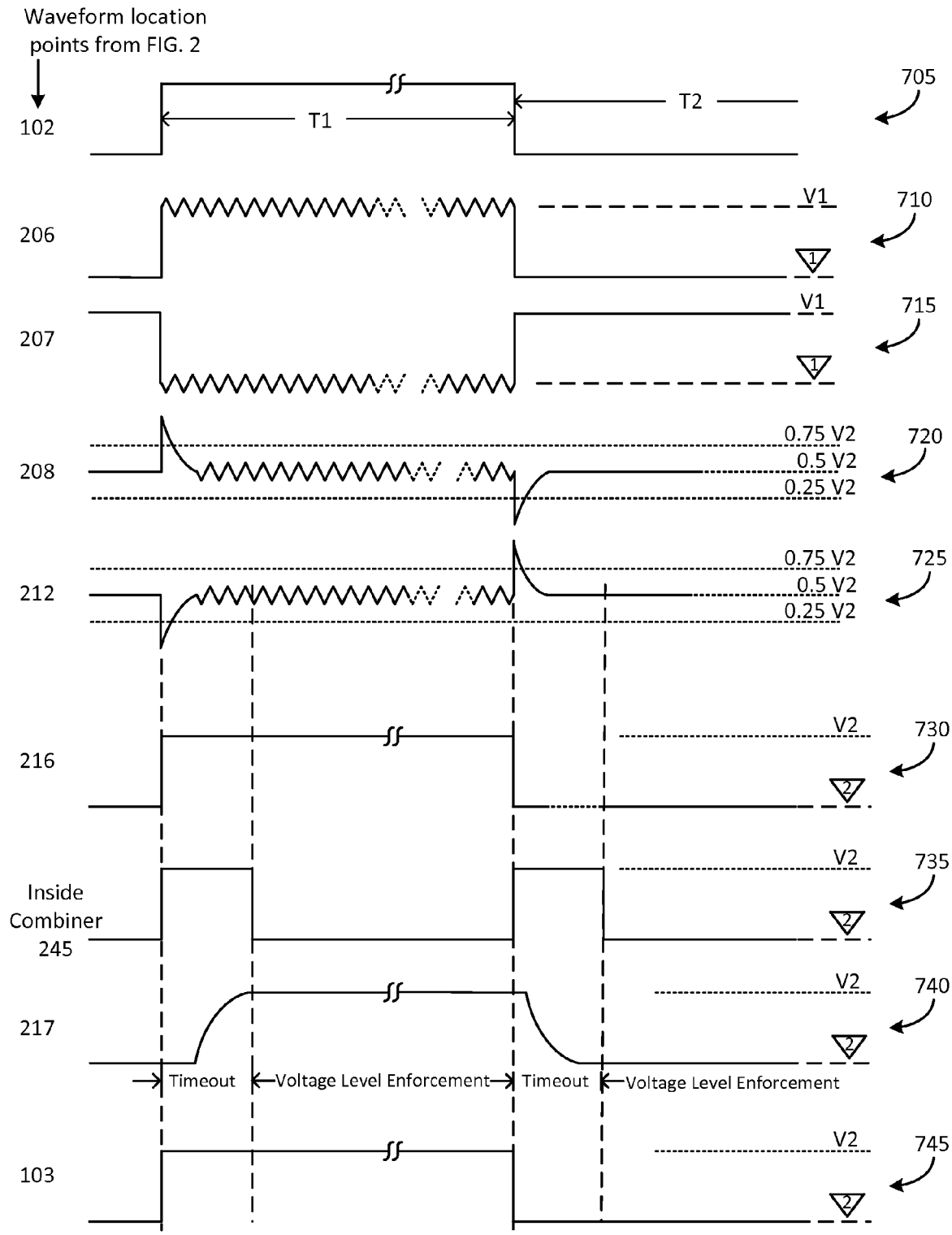
FIG. 7 shows some waveforms that are associated with propagating of digital data in accordance with a fifth exemplary embodiment of the invention.

FIG. 7 shows some waveforms that are associated with propagating of digital data from transmit circuit 105 to receive circuit 115 via isolation barrier 110 in accordance with a fifth exemplary embodiment of the invention. In this embodiment, the first carrier waveform is superimposed upon waveform 710 during the period of time designated as T1. However, no carrier waveform is superimposed upon waveform 710 during the period of time designated as T2. Similarly, the first carrier waveform is superimposed upon waveform 715 during the period of time designated as T1, but no carrier waveform is superimposed upon waveform 715 during the period of time designated as T2.

Similar to the embodiment described above using FIG. 5, the embodiment associated with FIG. 7, uses single carrier detection. Specifically, voltage level enforcer 240 detects the first carrier waveform present in waveforms 720 and 725 to determine the correct digital logic levels during T1 and T2, and uses this information to generate a voltage level enforcement signal that is provided via line 217 to combiner 245. The description of waveforms 720, 725, 730, 735, 740 and 745 can be understood from the description provided above using FIG. 3, and will not be repeated herein.

It will be noticed that the carrier waveform is shown as a triangular waveform in contrast to the sinusoidal waveforms shown in FIGS. 3-6. This depiction is directed at pointing out that various types of waveforms, such as triangular, trapezoidal, saw-tooth, square, or pulse train waveforms may be used in place of the sinusoidal carrier waveforms in FIGS. 3-6. As can be understood, the triangular carrier waveform shown in FIG. 7 may be replaced by a sinusoidal waveform such as shown in the other figures. Notwithstanding the type of waveform used, the amplitude of the waveform should be selected to be greater than 0.25 V2 and less than 0.75 V2. This aspect may be better understood from waveforms 720 and 725, where the amplitude of the triangular carrier waveform is selected to be centered on 0.5 V2 and have a voltage swing that is contained between 0.25 V2 and 0.75 V2 so as to preclude triggering the circuitry inside edge-triggered differential level transitioner 235 (that is described below in more detail using FIG. 13). However, the amplitude of the carrier waveform should be adequate for operational use inside voltage level enforcer 240 (that is described below in more detail using FIG. 13).

Figure 8:
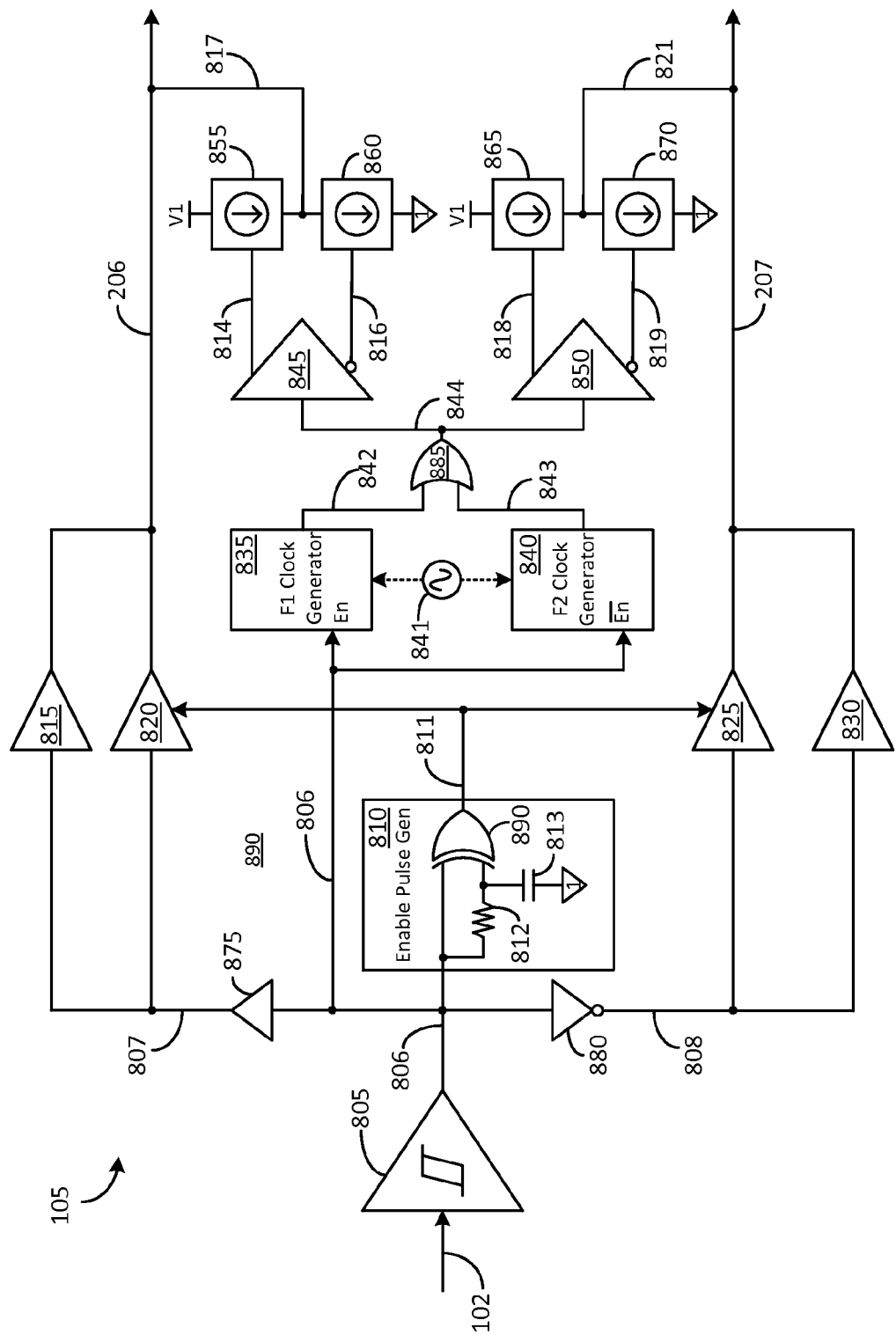
FIG. 8 shows an exemplary embodiment of a transmit circuit that may be used for propagating digital data across an isolation barrier.
Figure 9:
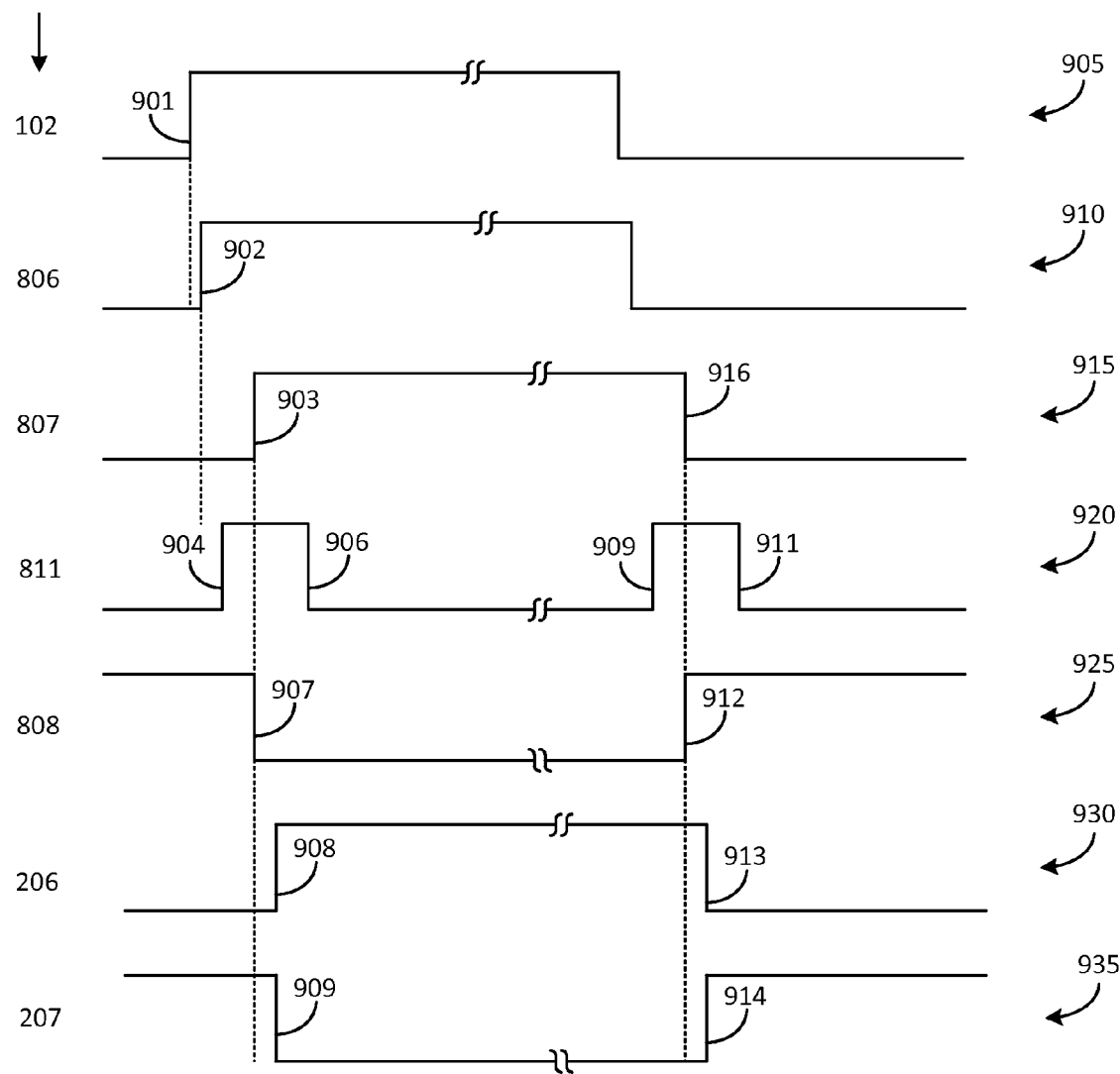
FIG. 9 shows waveforms that are present at certain nodes of the transmit circuit shown in FIG. 8.

FIG. 8 shows an exemplary embodiment of transmit circuit 105 that may be used for propagating digital data across isolation barrier 110. The functionality of transmit circuit 105 may be better understood by referring to various waveforms that are shown in FIG. 9. These waveforms are present at various locations of transmit circuit 105 shown in FIG. 8.

The digital input signal represented by waveform 905, is provided via line 102 to a Schmidt trigger 805. After a small propagation delay, Schmidt trigger 805 provides an output signal (represented by waveform 910) that is coupled to a non-inverting buffer 875, an inverting buffer 880, an enable pulse generator 810, and to two clock generators 835 and 840. Non-inverting buffer 875 drives a signal (represented by waveform 915) into a pair of line drivers 815 and 820.

Line driver 820 is a device having a large geometry structure that is selected to provide low on-resistance during signal propagation, and to accommodate large input signal swings that have fast transitioning edges. The output of line driver 820 is controlled via an output enable signal provided on line 811 by enable pulse generator 810. When the output enable signal is asserted, the signal present on line 807 is driven out by line driver 820 into line 206. However, when the output enable signal is unasserted, line driver 820 does not propagate the signal present on line 807 out to line 206. Under this state, the output of line driver 820 is disabled and presents a high impedance state to line 206.

It will be understood by one of ordinary skill in the art, that the signal on line 811 may be alternatively provided as a tri-stating signal rather than as an output enable signal, and line driver 820 may be accordingly selected to present a tri-stated output to line 206.

In operation, line driver 820, when enabled, drives the signal from line 807 into line 206 with fast rise and fall times and having a large drive capacity that is selected to advantageously drive digital signals through isolation barrier 110.

In contrast to line driver 820, which can be turned on or off, line driver 815 is a small geometry device that provides, at all times, a high resistance on-path for the signal present on line 807. Line driver 815 is selected for maintaining digital logic levels on line 206 at the same levels as those present on line 807. The operation of line driver 815 may be considered somewhat akin to having a pull-up resistor on line 206, thus preventing a logic high level from sagging whenever the output of line driver 820 is in a high-impedance/tri-stated condition.

In one implementation, line driver 820 is selected based on a geometry that is dimensionally three times as large as that contained in line driver 815.

Attention is now drawn to enable pulse generator 810. Enable pulse generator 810 may be implemented in several different ways. In the exemplary embodiment shown in FIG. 8, waveform 910 (on line 806) is provided directly to a first input of an exclusive-OR gate 890, and though a delay circuit to a second input of the exclusive-OR gate 890. The delay circuit is shown solely for purposes of description as an R-C circuit made up of resistor 812 and capacitor 813. Other delay circuits may be used instead. The delay circuit provides an offset between the signal entering the exclusive-OR gate 890 via the first input and the signal entering the exclusive-OR gate 890 via the second input. During this offset, the signal at the first input is at a logic level that opposes the logic level of the signal present at the second input. This one-zero logic condition at the input results in an output pulse being output from the exclusive-OR gate 890 at both the rising edge and the falling edge of the input signal (waveform 910). This output pulse is shown as waveform 920 in FIG. 9. Specifically, the time constant provided by the delay circuit (in this case, the R-C time constant) determines the pulse width indicated by a first pair of edges 904 and 906, as well as between a second pair of edges 909 and 911.

More significantly, the width of each of the output pulses (waveform 920) is selected specifically such that falling edge 906 occurs after the occurrence of rising edge 903 in waveform 915.

In other words, the pulse width between edges 904 and 906 is selected to provide a window functionality around rising edge 903 of waveform 915, thus ensuring that rising edge 903 is propagated out of line driver 820 when waveform 920 enables line driver 820 (via line 811).

Similarly, the pulse width between edges 909 and 911 is selected to provide a window functionality around falling edge 916 of waveform 915, thus ensuring that falling edge 916 is propagated out of line driver 820 when waveform 920 enables line driver 820 (via line 811).

Accurate operation of the window functionality is ensured by providing an appropriate propagation delay in non-inverting buffer 875. This propagation delay is indicated in FIG. 9 by the timing delay between edge 902 of waveform 910 and edge 903 of waveform 915. Inverting buffer 880 is similarly selected so as to provide a suitable delay between edge 902 of waveform 910 and edge 907 of waveform 925.

The operation of inverting buffer 880, line driver 825, and line driver 830 can be understood from the description above, by recognizing the similarities between line drivers 820 and 825, line drivers 815 and 830, and the output enable signal provided on line 811 to line driver 825. FIG. 9 shows waveforms 915, 920, 925, 930 and 935 that correspond to line 807, line 811, line 808, line 206 and line 207 respectively.

The operation of the two clock generators will now be described. The signal on line 806 (waveform 910) is provided as an enable signal to F1 clock generator 835 that generates the first carrier waveform, and also to F2 clock generator 840 that generates the second carrier waveform. Each of F1 clock generator 835 and F2 clock generator 840 may be configured to generate their respective carrier waveforms using a single clock source 841, or by using multiple clock sources. When using a single clock source 841, an integer multiple carrier waveform, an integer sub-multiple carrier waveform, or a non-integer ratio carrier waveform may be derived from by using appropriate circuitry such as a phase-lock loop, or a frequency divider circuit (e.g., a flip-flop). The derived carrier waveform may be used as either the first carrier waveform or the second carrier waveform.

As can be understood from FIG. 9, waveform 910 that is provided on line 806 operates as an enable signal to both F1 clock generator 835 and F2 clock generator 840. The output of F1 clock generator 835 is enabled upon the logic high levels of waveform 910, while the output of F2 clock generator 840 is enabled upon the logic low levels of waveform 910.

This operation is a result of the opposing polarities used to enable the two clock generators. (Attention is drawn to the fact that F1 clock generator 835 uses "En" logic, while F2 clock generator 840 uses "En*" logic.)

The first and second carrier waveforms provided on lines 842 and 843 respectively are coupled to an OR gate 885. It will be understood that only one or the other of the first or the second carrier waveforms will be present on lines 842 and 843 (depending on the logic level present on line 806) at any particular instant in time.

Line 844 carries the first or the second carrier waveform (when present respectively) to each of differential line drivers 845 and 850. Constant current generators 855, 860, 865 and 870 drive the first or the second carrier waveform on to lines 206 and 207, thereby superimposing the first or the second carrier waveform upon the signals driven by line drivers 820 and 825 respectively. Specifically, when line 206 is at a logic high level, current generator 860 is active and operates as a current sink to the local ground. Conversely, when line 206 is at a logic low level, current generator 855 is active and operates as a current source. Current generators 865 and 870 operate in a similar fashion.

The procedure described above may be better understood using waveforms 310 and 315 shown in FIG. 3. Specifically, when the differential line drivers 845 and 850 drive out the first carrier waveform, this first carrier waveform is superimposed upon waveforms 310 and 315 during the period designated T1. Similarly, when the differential line drivers 845 and 850 drive out the second carrier waveform, this second carrier waveform is superimposed upon waveforms 310 and 315 during the period designated T2.

The exemplary embodiment shown in FIG. 8 may be suitably modified to provide single carrier waveform operation, as well as for superimposing one or more carrier waveforms in the manner described in FIG. 3, 4, 5, 6, or 7. Such modifications may include eliminating F2 clock generator 840 and driving a single carrier waveform provided by F1 clock generator 835 on to both lines 206 and 207 at suitable times. The suitable times (T1 or T2) may be determined by using additional circuitry, such as for modifying the enable signal provided to F1 clock generator 835.

The modifications may further include replacing OR gate 885 with other logic circuitry better suited for various embodiments.

Figure 10:
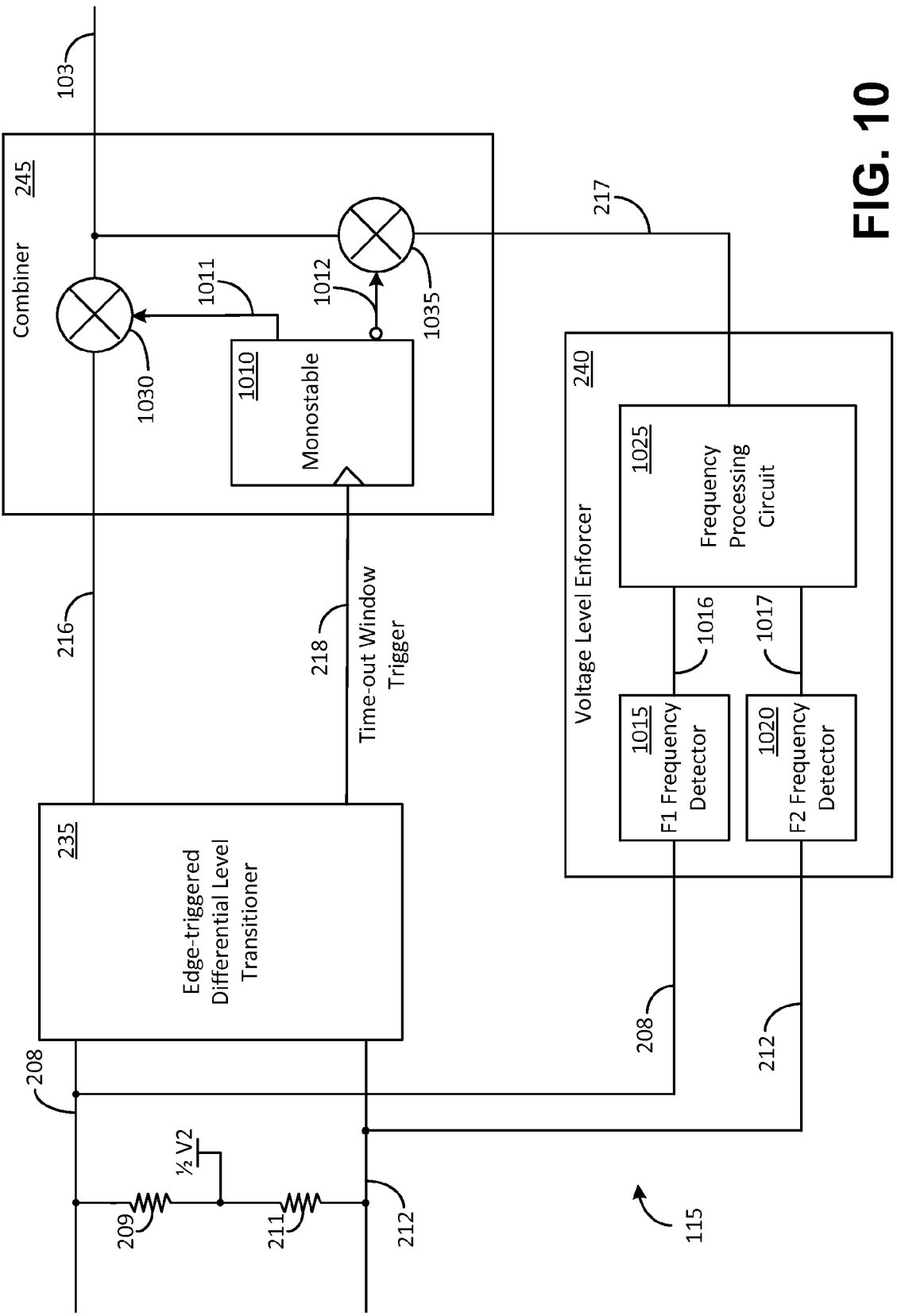
FIG. 10 shows an exemplary embodiment of a receive circuit that may be used for receiving digital data propagated across an isolation barrier.

Attention is now drawn to FIG. 10, which shows an exemplary embodiment of receive circuit 115 that may be used for receiving digital data propagated across isolation barrier 110. As mentioned above, edge-triggered differential level transitioner 235 receives the differential digital signal propagated through isolation barrier 110 via lines 208 and 212. A pair of pull-up resistors 209 and 211 coupled to voltage ½ V2, provide a DC quiescent biasing voltage of ½ V2 on each of lines 208 and 212. Edge-triggered differential voltage level transitioner 235 generates a digital output signal on line 216. The digital output signal on line 216 contains logic high levels and logic low levels that are triggered by the positive-going and negative-going transient spikes present in the signals on lines 208 and 212. The operation of edge-triggered differential level transitioner 235 will be described below in more detail using another figure.

The signals on lines 208 and 212 are also coupled into voltage level enforcer 240 that detects one or more of the carrier waveforms that may be present in the signals and uses the detection to provide the voltage level enforcement signal to combiner 245 via line 217.

To elaborate upon the functionality of voltage level enforcer 240, the signals on lines 208 and 212 are coupled into F1 frequency detector 1015 and F2 frequency detector 1020 respectively. Each of these two detectors may be configured in several different ways depending on the nature of the first and second carrier waveforms (F1 and F2). In a first implementation, one or both of these two detectors may include a low pass filter that is used to eliminate spurious frequencies that may be present in the signals provided via lines 208 and 212. In a second implementation, one or both of these two detectors may include a band pass filter that is used to selectively propagate the first and/or the second carrier waveforms and eliminate other frequencies. One of the two filters may be omitted when a single carrier waveform is used.

Notwithstanding the nature of the filter, each of F1 frequency detector 1015 and F2 frequency detector 1020 generates an output signal that is indicative of the presence or the absence of the respective frequency. For example, in one embodiment, a logic low level may be used to indicate the absence of a respective frequency and a logic high level may be used to indicate the presence of a respective frequency. The transition edges between the logic low level and the logic high level may be used to trigger a flip-flop contained inside frequency processing circuitry 1025, as described below using FIG. 11. In an alternative embodiment, each of the output signals may be carrier waveforms in analog signal form. The analog signals may be used to drive suitable circuitry contained inside frequency processing circuitry 1025, such as for example, the circuitry described below using FIG. 12.

The output signal of F1 frequency detector 1015 is coupled into frequency processing circuit 1025 via line 1016. Similarly, the output of F2 frequency detector 1020 is coupled into frequency processing circuit 1025 via line 1017. The operation of frequency processing circuit 1025, which generates the voltage level enforcement signal on line 217, is described below in more detail using other figures.

Combiner 245 includes a monostable 1010 that is triggered by the timeout window trigger provided on line 218 by edge-triggered differential level transitioner 235. Monostable 1010 generates a time-out window signal on line 1011 as a result of the trigger. This time-out window signal is indicated by waveform 335 in FIG. 3. A complementary time-out window signal is generated by monostable 1010 on line 1012 as well.

The time-out window signal on line 1011 is coupled to transmission gate 1030 that permits the digital output signal present on line 216 to pass through to line 103 whenever the time-out window signal is at a logic high level (alternatively, a logic low level may be used for this purpose).

Similarly, the complementary time-out window signal on line 1012 is coupled to transmission gate 1035 and permits the voltage level enforcement signal on line 217 to pass through to line 103. This action may be better understood from FIG. 3, where the voltage level enforcement signal is indicated by waveform 340. When transmission gate 1035 permits the voltage level enforcement signal on line 217 to pass through to line 103, this logic level, which is present after the timeout period, is driven on to line 103.

The time-out window signal on line 1011 that is coupled to transmission gate 1030 blocks the signal on line 216 from passing through to line 103, when the time-out window signal on line 1012 that is coupled to transmission gate 1035 permits the voltage level enforcement signal on line 217 to pass through to line 103.

This gating action provides a mechanism whereby the logic level present on line 216 is ignored during the voltage level enforcement period, irrespective of the logic level being correct or wrong. If the logic level present on line 216 is correct, the voltage level enforcement signal merely confirms the correctness. On the other hand, if the logic level present on line 216 is incorrect, the voltage level enforcement signal rectifies the error. The error rectification condition may be indicated via an error indicator circuit (not shown), such as for example, a circuit that produces an output signal with a suitable logic level indication, or a circuit that includes a register with a designated error condition bit (a flag).

Furthermore, edge-triggered differential level transitioner may be configured to power up in a known default state (based on customer requirement, perhaps), whereby the error indicator circuit can indicate an error when voltage level enforcer 240 comes into play subsequently. This error indication provides a mechanism to detect a power-related problem in receive circuit 115, such as a power supply interruption, or a hardware failure (reset condition etc).

As mentioned above, the logic level present on line 216 may turn incorrect for a variety of reasons. For example, the logic level may incorrectly go to a logic low level, if receiver 115 were to power-up after a power failure. The logic level may incorrectly also go to a wrong level as a result of voltage transients occurring in receiver 115. The operation of voltage level enforcer 240 is directed at addressing and overcoming such errors.

Figure 11:
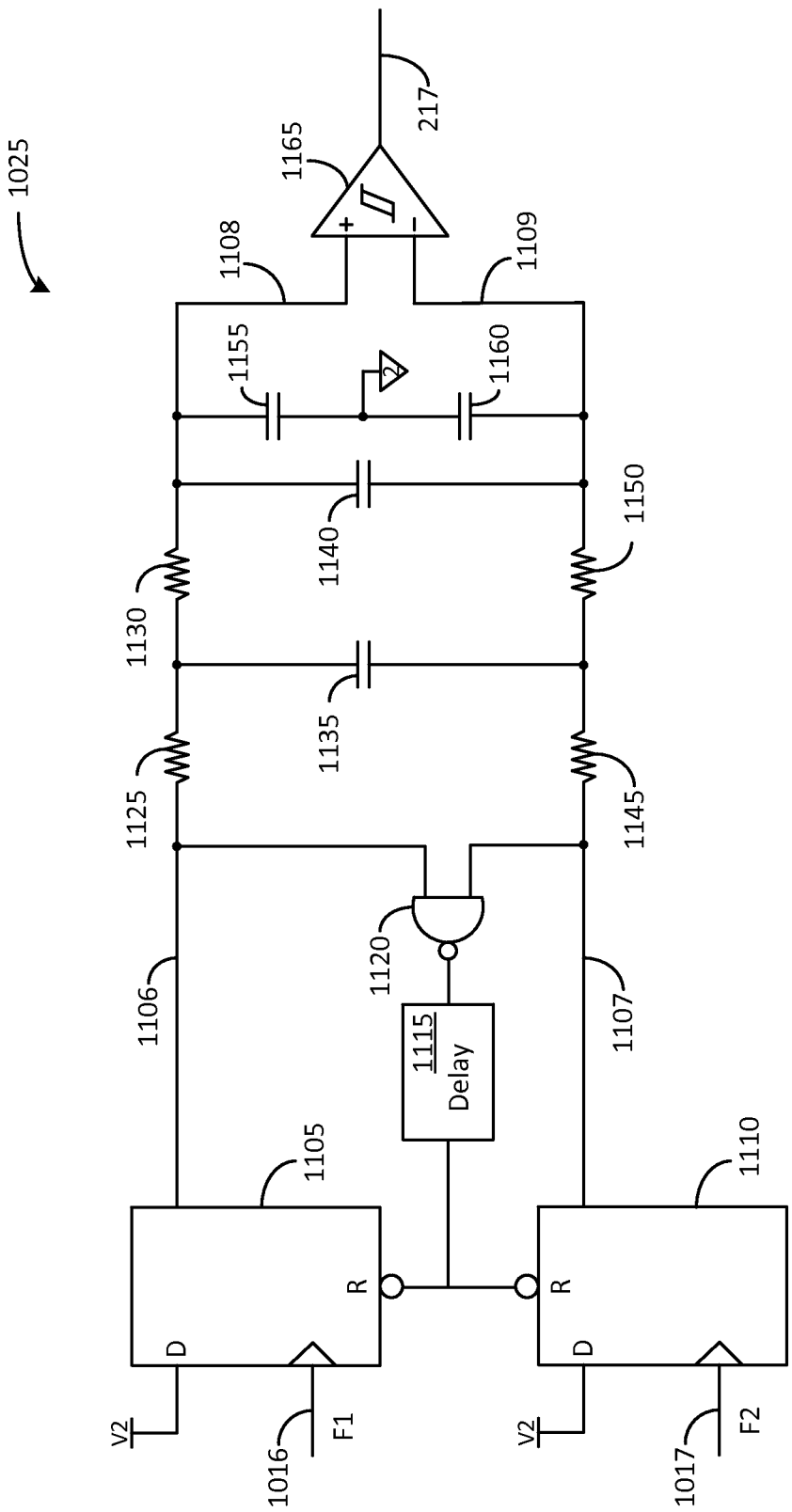
FIG. 11 shows a first exemplary embodiment of a frequency processing circuit that is a part of the receive circuit shown in FIG. 10.

FIG. 11 shows a first exemplary embodiment of a frequency processing circuit 1025 that is shown inside voltage level enforcer 240 in FIG. 10. In this embodiment, frequency processing circuit 1025 is configured as a frequency ratio detector, with the voltage level enforcement signal on line 217 going to a first logic level whenever F1/F2>1, and going to an opposing logic level whenever the F1/F2<1. The frequency ratio detector approach can be used for the two carrier waveform embodiments, as well as for the single carrier waveform embodiments described above.

As shown in FIG. 10, the output signal of F1 frequency detector 1015 is provided on line 1016. This output signal is coupled to the clock trigger input of flip-flop 1105. Flip-flop 1105 transitions to a logic high level whenever an activating edge is present on line 1016. This logic high level is coupled through a NAND gate and a delay element 1115 thereby providing a suitable reset signal that is used to reset line 1106 to a logic low level after a delay period determined by NAND gate 1120 and delay element 1115.

A similar action is carried out on flip-flop 1110 on the basis of the clock trigger signal provide on line 1017 from F2 frequency detector 1020.

The differential signal present on lines 1106 and 1107 are coupled into one or more filter stages that are indicated by resistors 1125, 1130, 1145 and 1150, and capacitors 1135, 1140, 1155 and 1160. Differential amplifier/buffer 1165 provides hysteresis to the filtered differential signal and generates the voltage level enforcement signal on line 217. As can be understood, the logic levels present in the voltage level enforcement signal are directly reflective of the F1/F2>1 or F1/F2<1 logic level differential condition present on the input terminals of differential amplifier/buffer 1165.

Figure 12:
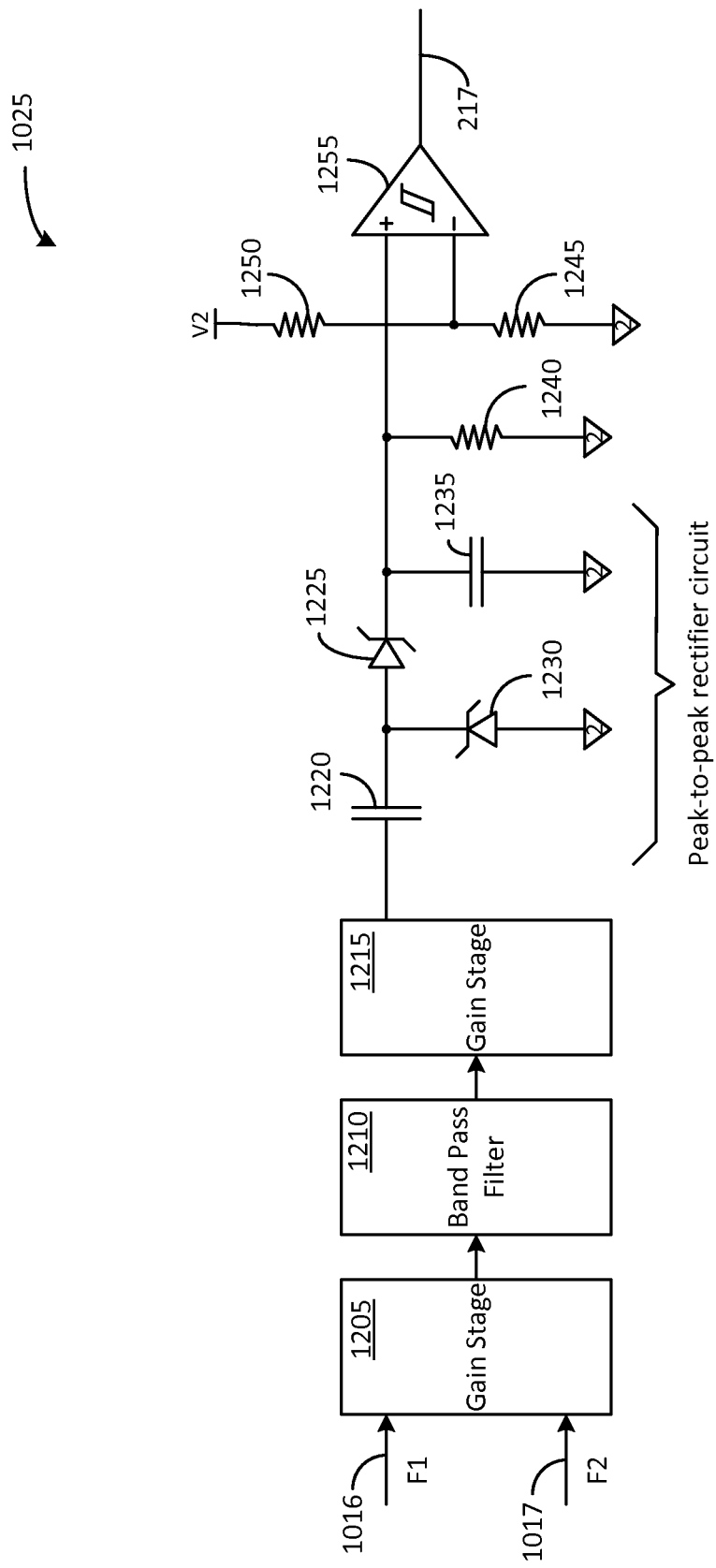
FIG. 12 shows a second exemplary embodiment of a frequency processing circuit that is a part of the receive circuit shown in FIG. 10.

FIG. 12 shows a second exemplary embodiment of a frequency processing circuit 1025 that is shown inside voltage level enforcer 240 in FIG. 10. In this embodiment, frequency processing circuit 1025 is configured as a carrier waveform presence/absence detector, with the voltage level enforcement signal on line 217 going to a first logic level whenever the carrier waveform is present, and vice-versa. This detector circuit is typically used for the single carrier waveform embodiments.

As shown in FIG. 10, the output signal of F1 frequency detector 1015 is provided on line 1016. This output signal is coupled to gain stage 1205 and further propagated through a band pass filter 1210 and an additional gain stage 1215. The output of gain stage 1215 is provided to a peak-to-peak rectifier circuit formed of capacitor 1220, detector diode 1230, detector diode 1225, and capacitor 1235. The output of the peak-to-peak rectifier circuit is coupled into a first input of comparator 1255, which provides a hysteresis action, and generates the voltage level enforcement signal on line 217 whenever the detected level exceeds a reference voltage level that is suitably set using resistors 1250 and 1245.

Figure 13:
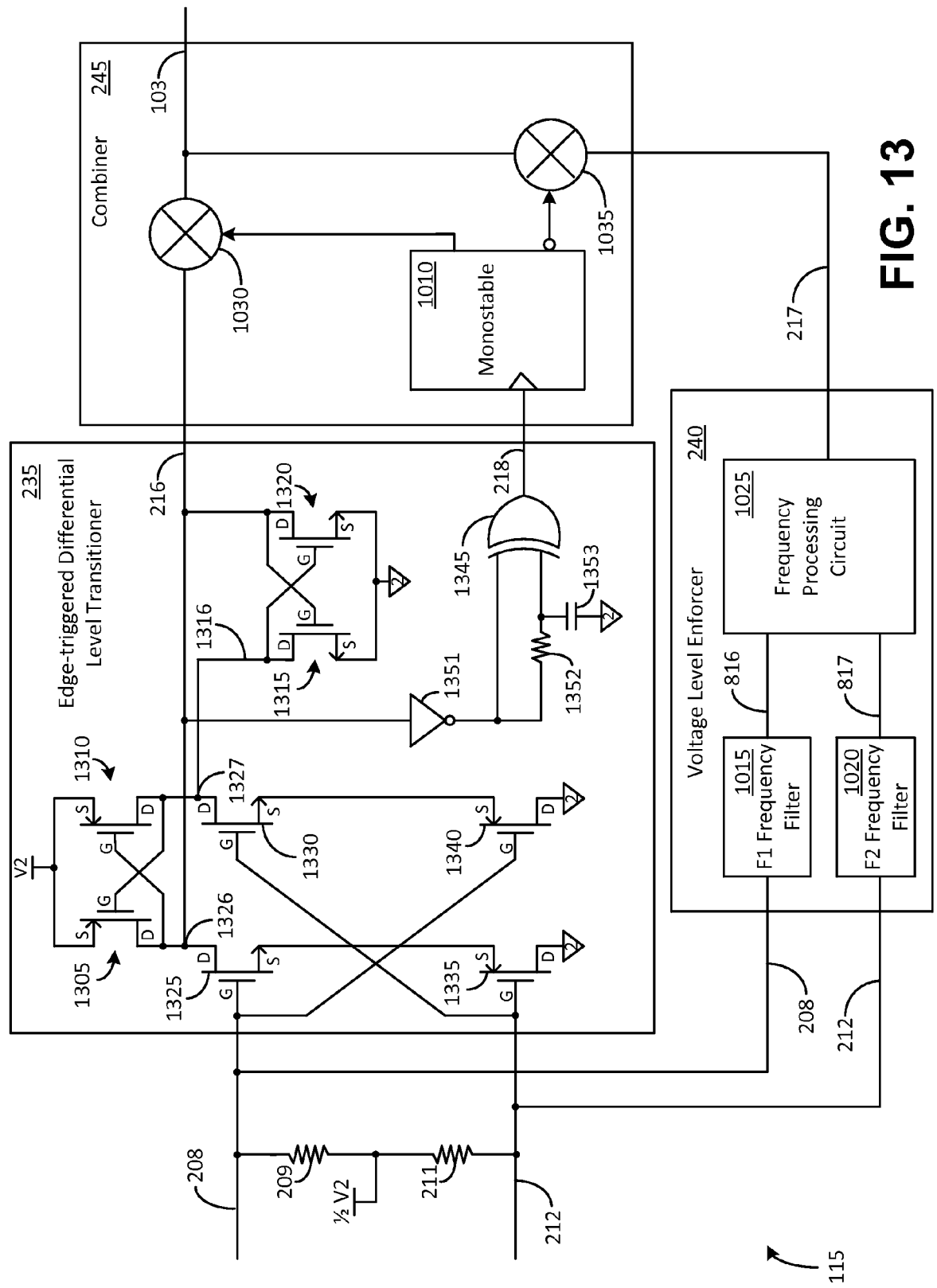
FIG. 13 shows some details of an edge-triggered differential level transitioner that is a part of the receive circuit shown in FIG. 10.

FIG. 13 shows some details of edge-triggered differential level transitioner 235 that is a part of receive circuit 115 shown in FIG. 10. The differential digital signal propagated through isolation barrier 110 (not shown) is coupled to via lines 208 and 212 into receive circuit 115, specifically into the gate terminals of four field-effect transistors (FETs) 1325, 1335, 1330 and 1340.

The pair of pull-up resistors 209 and 211 coupled to voltage ½ V2, provide a DC quiescent biasing voltage of ½ V2 on each of lines 208 and 212, thereby applying the DC quiescent biasing voltage upon each of the gate terminals of the four FETs 1325, 1335, 1330 and 1340.

As described above (using FIG. 2), each of the signals appearing on lines 208 and 212 appear as positive-going or negative-going transient spikes that are in temporal alignment to the positive-going and negative-going transition edges of the differential digital signal provided to isolation barrier 110 from transmit circuit 105.

The functionality of edge-triggered differential level transitioner 235 may be better understood by referring to certain waveforms shown in FIG. 3 (and also in FIGS. 4-7). Specifically, attention is first drawn to waveforms 320 and 325 that are provided on lines 208 and 212 respectively.

The first positive-going transient spike shown in waveform 320 turns on FET 1325 (an nFET), and simultaneously turns off FET 1340 (a pFET). At the same time, the first corresponding negative-going transient spike shown in waveform 325, turns on FET 1335 (a pFET), and simultaneously turns off FET 1330 (an nFET).

As a result of FETs 1325 and 1335 turning on, the voltage at node 1326 is pulled down to a logic low level. At this time, as a result of FETs 1330 and 1340 turning off, the voltage at node 1327 is pulled up to a logic high level.

Turning now to the first negative-going transient spike shown in waveform 320, this negative-going transient spike turns off FET 1325, and simultaneously turns on FET 1340. The corresponding positive-going transient spike shown in waveform 325, turns off FET 1335, and simultaneously turns on FET 1330.

As a result of FETs 1325 and 1335 turning off, the voltage at node 1326 is pulled up to a logic high level. At this time, as a result of FETs 1330 and 1340 turning on, the voltage at node 1327 is pulled down to a logic low level.

pFETS 1305 and 1310 are cross-coupled to each other and operate in conjunction with nFETs 1315 and 1320 as an R-S flip flop, such that the voltage levels produced at nodes 1326 and 1327 cause lines 216 and 1316 to latch to the corresponding voltage levels. Thus, when the voltage at node 1326 is pulled up to a logic high level, line 216 remains at a logic high level until the next pair of transient pulses appears on waveforms 320 and 325. Similarly, when the voltage at node 1327 is pulled down to a logic low level, line 1316 remains at a logic low level until the next pair of transient pulses appears on waveforms 320 and 325.

The logic level transition on line 216 is coupled to a pulse forming circuit through an inverting buffer 1351 that prevents or minimizes the effects of loading on line 216. An inverting buffer may be used alternatively in some embodiments. The pulse forming circuit includes an exclusive-OR gate 1345 and a delay circuit formed of resistor 1352 and capacitor 1353. Specifically, the output of inverting buffer 1351 is coupled into a first input of exclusive-OR gate 1345, while the same output is also coupled to a second input of exclusive-OR gate 1345 via a delay circuit formed of resistor 1352 and capacitor 1353. The operation of the delay circuit and exclusive-OR gate 1345 is similar to that described above for enable pulse generator 810 vis-à-vis FIG. 8. The output of exclusive-OR gate 1345 is coupled via line 218 into monostable 1010 contained in combiner 245.

It will be understood that the pulse-forming circuit shown in FIG. 13 is exemplary in nature, and alternative circuits may be employed in various embodiments. Also, attention is drawn to the S, D, and G labels on the various FETs shown in FIG. 13. These labels indicate the source, drain, and gate terminals of each of these devices.

Figure 14:
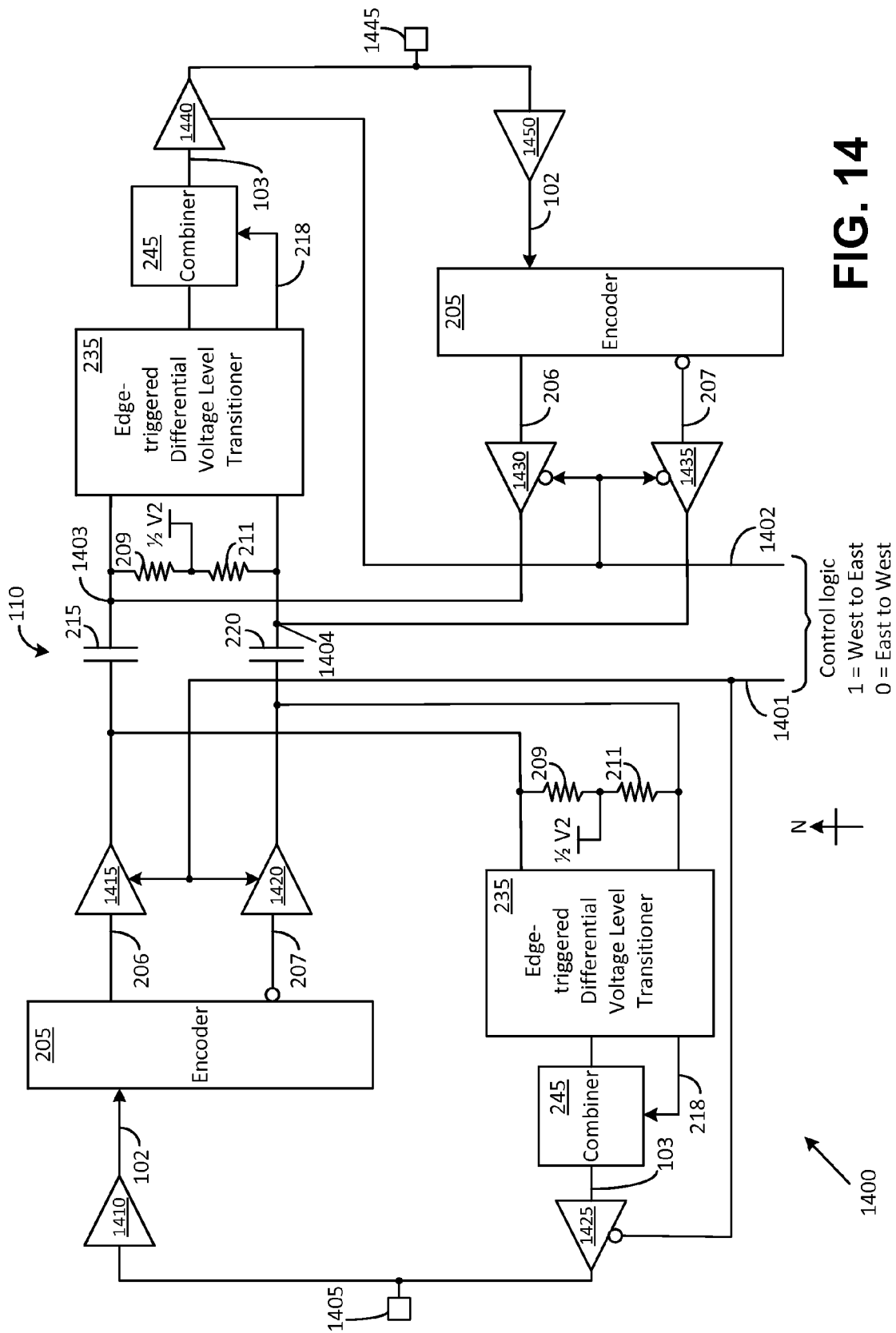
FIG. 14 shows an exemplary embodiment of a system for propagating digital data bi-directionally across an isolation barrier.

FIG. 14 shows an exemplary embodiment of a system 1400 for propagating digital data bi-directionally from one digital data domain to another digital data domain across an isolation barrier. Various tri-statable buffers are used to control data flow in the two directions. Control logic circuitry (not shown) is used to set control lines 1401 and 1402 to a logic high level that permits west-to-east data propagation, or to a logic low level that permits east-to-west data propagation. Two separate control lines 1401 and 1402 are shown because line 1401 may be located in the transmit side domain that is isolated from the receive side domain where line 1402 may be located, with individual control logic circuitry driving each of these two control lines independently (even though identical logic levels may be applied simultaneously to both control lines).

Specifically, when control lines 1401 and 1402 are both set to a logic high level, buffers 1415 and 1420 are enabled so as to allow these two buffers to propagate the digital data present on lines 206 and 207, into isolation barrier 110. Buffer 1440 is also enabled so as to propagate out to terminal 1445, digital data present on line 103. The same logic high level of control lines 1401 and 1402 results in buffers 1425, 1430 and 1435 being tri-stated thus preventing digital data propagation through any of these buffers in the east-to-west direction.

When control lines 1401 and 1402 are both set to a logic low level, buffers 1430 and 1435 are enabled so as to allow these two buffers to propagate digital data present on lines 206 and 207 into isolation barrier 110. Buffer 1425 is also enabled so as to propagate out to terminal 1405, digital data present on line 103. The same logic low state of control lines 1401 and 1402 results in buffers 1415, 1420 and 1440 being tri-stated thus preventing digital data propagation through any of these buffers in the west-to-east direction.

It will be recognized that the bi-directional digital data propagation is carried out through a single pair of capacitors 215 and 220 that are provided in isolation barrier 110. This arrangement minimizes the number of coupling capacitors, as well as the number of interconnecting lines, that are located in isolation barrier 110, thereby providing a number of benefits. For example, this arrangement with a minimal number of conduction paths, provides a higher level of voltage isolation in terms of reducing undesirable voltage transients from one digital data domain being transferred to the other digital data domain. The arrangement also provides a higher level of transient voltage immunity in terms of protecting input circuitry in the two digital data domains.

To elaborate upon this aspect, attention is drawn to buffers 1430 and 1435 whose outputs are coupled to nodes 1403 and 1404. Nodes 1403 and 1404 are located on signal lines that are coupled into receiver circuitry inside edge-triggered differential voltage level transitioner 235. The receiver circuitry is typically susceptible to damage from excessive voltages that may be subjected upon nodes 1403 and 1404. However, in this arrangement, such excessive voltages are dissipated into the output side circuitry contained inside buffers 1430 and 1435. The output side circuitry presents a high impedance state when buffers 1430 and 1435 are tri-stated by the control logic. As explained above, buffers 1430 and 1435 are placed in the tri-state condition when digital data is flowing in the west-to-east direction through nodes 1403 and 1404 into edge-triggered differential voltage level transitioner 235.

The person skilled in the art will appreciate that the systems, circuits, and methods described herein allow for propagating digital data from a transmit side domain to a receive side domain through an intermediate isolation barrier. While the devices and methods have been described by means of specific embodiments and applications thereof, it is understood that numerous modifications and variations could be made thereto by those skilled in the art without departing from the spirit and scope of the disclosure.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A method comprising:
    superimposing a first carrier waveform upon a first logic level of a first digital signal, the first digital signal using a first local ground as a reference level;
    superimposing a second carrier waveform upon a second logic level of the first digital signal;
    propagating the first digital signal comprising the superimposed first carrier waveform, through an isolation barrier; and
    processing the propagated digital signal using a second local ground that is different than the first local ground, the processing comprising:
        using the first carrier waveform to enforce the first logic level upon an output digital signal generated from the propagated digital signal, the enforcing comprising:
            detecting the first carrier waveform in the propagated digital signal; and
            setting the output digital signal to the first logic level upon detecting the first carrier waveform in the propagated digital signal; and
        using the second carrier waveform to enforce the second logic level upon the output digital signal generated from the propagated digital signal.

2. The method of claim 1, wherein the propagated digital signal comprises a first transient pulse indicative of one of a rising or a falling edge, and a second transient pulse indicative of a succeeding one of a falling or a rising edge respectively; and further wherein the first transient pulse is used to a) set the output digital signal to the first logic level prior to occurrence of the second transient pulse, and b) trigger detection of the first carrier waveform in the propagated digital signal.

3. The method of claim 1, wherein the first digital signal is propagated through the isolation barrier in a differential digital signal format via a pair of coupling capacitors.

4. The method of claim 1, wherein the first digital signal is propagated through the isolation barrier in a differential digital signal format.

5. The method of claim 1, wherein the frequency of the first carrier waveform is an integer multiple or an integer submultiple of a frequency of the second carrier waveform.

6. The method of claim 1, wherein the frequency of the first second carrier waveform is a non-integer ratio of a frequency of the second carrier waveform.

7. The method of claim 6, wherein the non-integer ratio is equal to about 1.7.

8. A method comprising:
superimposing a first carrier waveform upon a first logic level of a complementary pair of digital signals;
superimposing a second carrier waveform upon a second logic level of the complementary pair of digital signals;
propagating the complementary pair of digital signals comprising the superimposed first and second carrier waveforms, through an isolation barrier; and
processing the propagated complementary pair of digital signals using a second local ground that is different than a first local ground used to generate the complementary pair of digital signals, the processing comprising using the first and second carrier waveforms to enforce the first and second logic levels upon an output digital signal generated from the propagated complementary pair of digital signals.

9. The method of claim 8, wherein propagating the complementary pair of digital signals through the isolation barrier comprises capacitively coupling the complementary pair of digital signals through the isolation barrier.

10. The method of claim 8, further comprising:
setting the amplitude of the first carrier waveform to zero prior to propagating the complementary pair of digital signals through the isolation barrier.

11. The method of claim 8, wherein each of the complementary pair of digital signals comprises a first transient pulse indicative of one of a rising or a falling edge, and a second transient pulse indicative of a succeeding one of a falling or a rising edge respectively; and further wherein the first transient pulse is used to a) set the output digital signal to the first logic level prior to occurrence of the second transient pulse, and b) trigger detection of the first carrier waveform in the propagated digital signal.

12. A system comprising:
a transmit circuit referenced to a first local ground and configured to superimpose a first carrier waveform upon a first logic level of a first digital signal, the transmit circuit comprising:
an encoder that uses at least a first clock to superimpose the first carrier waveform upon the first logic level of the first digital signal, and drives the first digital signal with the first carrier waveform superimposed thereon, through the isolation barrier, in a differential digital signal format;
an isolation barrier; and
a receive circuit for receiving the first digital signal after propagation through the isolation barrier, and generating therefrom, an output digital signal, the receive circuit comprising a voltage level enforcer that uses the first carrier waveform to enforce the first logic level upon the output digital signal.

13. The system of claim 12, further comprising a pair of coupling capacitors located in the isolation barrier, the a pair of coupling capacitors configured to capacitively couple the first digital signal in the differential digital signal format from the transmit circuit to the receive circuit.

14. The system of claim 12, wherein the receive circuit further comprises:
an edge-triggered differential voltage level transitioner referenced to a second local ground that is different than the first local ground, the edge-triggered differential voltage level transitioner configured to generate a time-out window trigger.

15. The system of claim 14, wherein the receive circuit further comprises:
a combiner that uses the time-out window trigger to implement a time-out period during which the voltage level enforcer is prevented from enforcing the first logic level upon the output digital signal.

16. The system of claim 12, wherein the transmit circuit is further configured to superimpose a second carrier waveform upon a second logic level of the first digital signal.

17. The system of claim 16, wherein the voltage level enforcer comprises a frequency processing circuit for detecting at least one of a) a presence of the first carrier waveform, or b) a relationship between the first carrier waveform and the second carrier waveform.

* * * * *